United States Patent
Kuroda et al.

(10) Patent No.: US 7,511,375 B2
(45) Date of Patent: Mar. 31, 2009

(54) SEMICONDUCTOR DEVICE CARRIER UNIT AND SEMICONDUCTOR SOCKET PROVIDED THEREWITH

(75) Inventors: Toshitaka Kuroda, Kawasaki (JP); Minoru Hisaishi, Tokyo (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 452 days.

(21) Appl. No.: 11/236,722

(22) Filed: Sep. 28, 2005

(65) Prior Publication Data

US 2006/0071331 A1   Apr. 6, 2006

(30) Foreign Application Priority Data

Oct. 1, 2004 (JP) ............................. 2004-290569

(51) Int. Cl.
*H01L 23/34* (2006.01)

(52) U.S. Cl. ............................. 257/727; 257/E23.078; 439/73; 439/66; 439/71; 216/18; 216/20; 438/17

(58) Field of Classification Search .......... 257/E21.522, 257/E21.533, E23.078, 727; 439/70–73, 439/66, 526; 216/18, 20; 438/17, 18
See application file for complete search history.

(56) References Cited

U.S. PATENT DOCUMENTS

| | | | |
|---|---|---|---|
| 4,548,451 A | 10/1985 | Benarr et al. | |
| 5,173,055 A | 12/1992 | Grabbe | |
| 5,297,967 A | 3/1994 | Baumberger et al. | |
| 5,452,183 A * | 9/1995 | Renn et al. | 361/789 |
| 5,595,240 A * | 1/1997 | Daikoku et al. | 165/80.4 |
| 5,629,837 A | 5/1997 | Barabi et al. | |
| 6,174,174 B1 * | 1/2001 | Suzuki et al. | 439/71 |
| 6,191,604 B1 | 2/2001 | Haseyama et al. | |
| 6,262,581 B1 * | 7/2001 | Han | 324/755 |
| 6,439,897 B1 * | 8/2002 | Ikeya | 439/73 |
| 6,474,997 B1 | 11/2002 | Ochiai | |
| 6,607,396 B1 * | 8/2003 | Ito | 439/331 |
| 6,752,643 B2 | 6/2004 | Hisaishi et al. | |
| 6,910,898 B2 | 6/2005 | Suzuki et al. | |

FOREIGN PATENT DOCUMENTS

| | | |
|---|---|---|
| DE | 199 28 524 A1 | 12/1999 |
| JP | 03-120742 | 5/1991 |
| JP | 06-313788 | 11/1994 |
| JP | 08-018292 | 1/1996 |
| JP | 08-068829 | 3/1996 |
| JP | 08-288037 | 11/1996 |
| JP | 09-017539 | 1/1997 |

(Continued)

OTHER PUBLICATIONS

Official Notice of Rejection from the Japan Patent Office dated Sep. 11, 2007 in corresponding Japanese Patent Application No. 2004-290569.

(Continued)

*Primary Examiner*—Chris C. Chu
(74) *Attorney, Agent, or Firm*—Finnegan, Henderson, Farabow, Garrett & Dunner, LLP (57) ABSTRACT

In a pressing cap forming part of a semiconductor device carrier unit, a pressing portion of a pressure body has recesses, to each of which a bump is inserted.

4 Claims, 13 Drawing Sheets

FOREIGN PATENT DOCUMENTS

| | | |
|---|---|---|
| JP | 09-021828 | 1/1997 |
| JP | 09-115910 A | 5/1997 |
| JP | 09-274066 | 10/1997 |
| JP | 10-022024 | 1/1998 |
| JP | 10-260222 | 9/1998 |
| JP | 11-204223 | 7/1999 |
| JP | 11-211755 | 8/1999 |
| JP | 11-326379 | 11/1999 |
| JP | 2000-003984 | 1/2000 |
| JP | 2000-030828 | 1/2000 |
| JP | 2000-123935 | 4/2000 |
| JP | 2000-191036 | 7/2000 |
| JP | 2000-214216 | 8/2000 |
| JP | 2000-252409 A | 9/2000 |
| JP | 2001-013207 | 1/2001 |
| JP | 2001-094244 A | 4/2001 |
| JP | 2002-303652 | 10/2002 |
| JP | 2003-149289 | 5/2003 |
| JP | 2004-047186 | 2/2004 |

OTHER PUBLICATIONS

Co-Pending U.S. Appl. No. 10/233,500, issued as U.S. Pat. No. 6,969,262 on Nov. 29, 2005 Title: IC SOCKET U.S. Filing Date: Sep. 4, 2002.

Co-Pending U.S. Appl. No. 10/614,196; issued as U.S. Pat. No. 6,910,898 on Jun. 28, 2005, Title: Socket for Semiconductor Device U.S. Filing Date: Jul. 8, 2003.

Co-Pending U.S. Appl. No. 11/166,383, Title: Socket for Semiconductor Device U.S. Filing Date: Jun. 27, 2005.

Office Action in co-pending U.S. Appl. No. 10/233,500 dated Apr. 20, 2004 (Ex. Luebke).

Office Action in co-pending U.S. Appl. No. 10/233,500 dated Dec. 17, 2003 (Ex. Nguyen).

Office Action in co-pending U.S. Appl. No. 10/233,500 dated Jan. 25, 2005 (Ex. Luebke).

Office Action in co-pending U.S. Appl. No. 10/233,500 dated Sep. 16, 2004 (Ex. Luebke).

Office Action in co-pending U.S. Appl. No. 10/614,196 dated Feb. 10, 2004 (Ex. Gilman).

Office Action in co-pending U.S. Appl. No. 10/614,196 dated Jul. 26, 2004 (Ex. Gilman).

Office Action in co-pending U.S. Appl. No. 10/614,196 dated Oct. 18, 2005 (Ex. Gilman).

Office Action, dated Dec. 21, 2005, issued by German Patent Office in corresponding German Patent Application No. 1033137.1-34.

Office Action, dated Nov. 22, 2005, issued by Japanese Patent Office in corresponding Japanese Patent Application No. 2002-200459.

Office Action from People's Republic of China in corresponding Chinese Patent Application No. 2005-10083157.6 dated Apr. 20, 2007.

Office Notice of Final Decision for Rejection of Japanese Patent Application No. 2002-200459, dated Jun. 2, 2006, with English Translation.

Official Notice of Rejection of Japanese Patent Office, Patent Application No. 2001-268985, mailed Apr. 22, 2005.

* cited by examiner

PRIOR ART

FIG.13

SEMICONDUCTOR DEVICE CARRIER UNIT AND SEMICONDUCTOR SOCKET PROVIDED THEREWITH

This application claims priority from Japanese Patent Application No. 2004-290569 filed Oct. 1, 2004, which is incorporated hereinto by reference.

BACKGROUND OF THE INVENTION

1. Field of the Invention

The present invention relates to a semiconductor device carrier unit for housing a bare chip in a detachable manner and a semiconductor socket provided therewith.

2. Description of the Related Art

A test jig used for a burn-in test is generally called as an IC socket. In the IC socket for testing a KGD (known good die) which is a tested good bare chip, the proposition that such a bare chip is mounted to a housing portion in the IC socket via a carrier unit as disclosed in Japanese Patent Application Laid-open No. 2003-149289 has been put forth.

Figure 13:
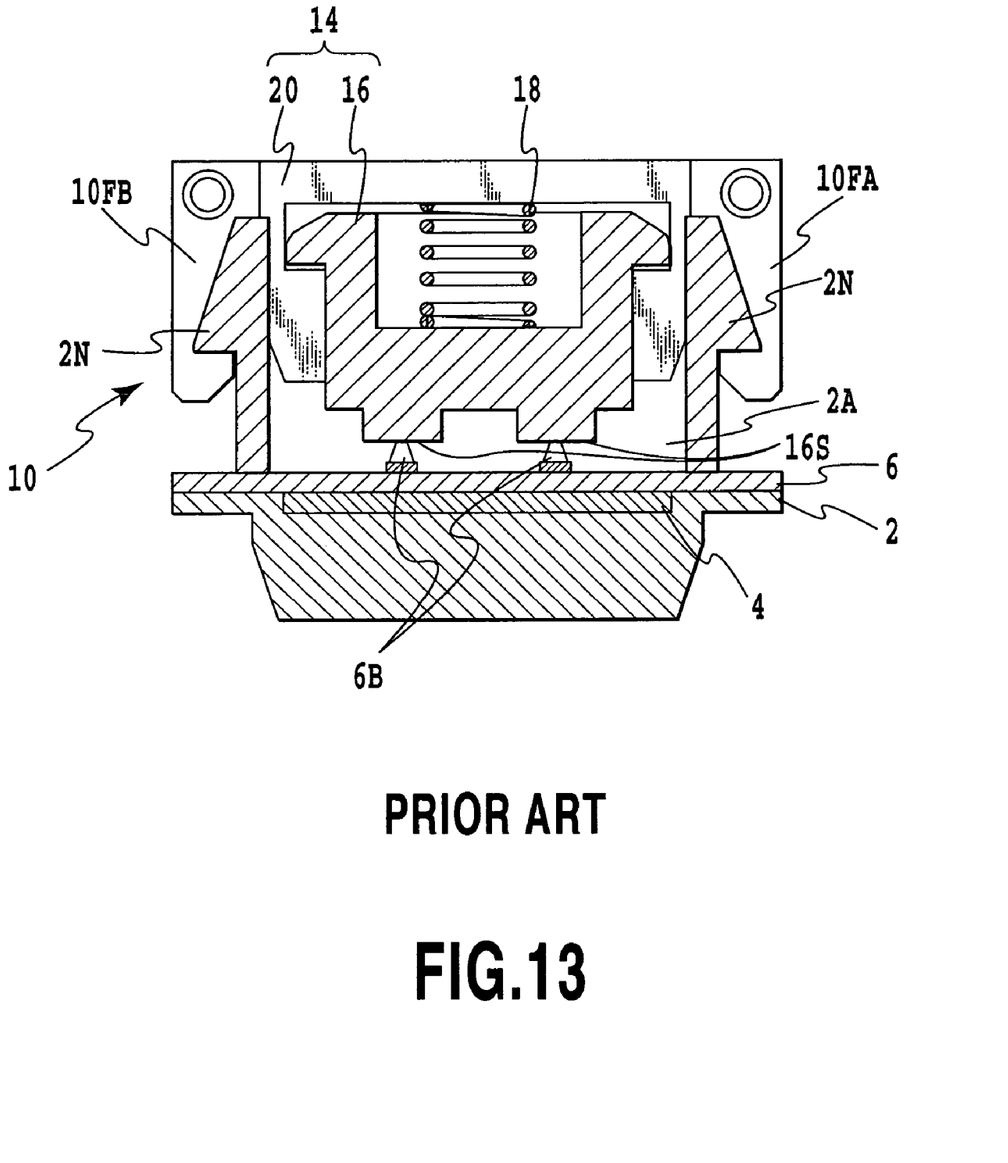
FIG. 13 is a diagrammatic sectional view of a structure in the conventional semiconductor device carrier unit.

For example, as shown in FIG. 13, the carrier unit includes, for example, a carrier housing 2 having a housing portion 2A for housing a single bare chip (not shown), a sheet with electrodes 6 disposed as a connecting substrate in the inner bottom of the housing portion 2A of the carrier housing 2 via an elastic sheet 4, a pressing cap 14 for pressing a group of electrodes of the bare chip to bumps 6B of the sheet with electrodes 6, and a latch mechanism 10 for selectively holding the pressing cap 14 in the carrier housing 2.

As shown in FIG. 13, the sheet with electrodes 6 has a bump group consisting of a plurality of bumps 6B formed of copper or others disposed opposite to the electrode group of the bare chip (not shown). A tip end of the respective bump 6B is projected from a surface of the sheet with electrodes 6 at a predetermined height. In this regard, in FIG. 13, only two of the bumps 6B in the bump group are exaggeratedly represented as for simplifying the drawing.

The pressing cap 14 includes a pressure body 16 having a pressing portion 16s in contact with a surface (upper surface) opposed to a surface on which the electrode group of the bare chip are formed (a lower surface), a cap body 20 having a recess for housing a base of the pressure body 16, and a spring 18 disposed in a space between the base of the pressure body 16 and an inner surface defining the recess of the cap body 20 for biasing the pressure body 16 toward the bare chip.

The base of the pressure body 16 has a flange on the outer periphery thereof and is inserted in the recess of the cap body 20 in a movable manner. The cap body 20 is provided on opposite outer surfaces thereof with hook members 10FA and 10FB, respectively, of the latch mechanism 10 in a rotational movable manner.

The latch mechanism 10 includes the above-mentioned hook members 10FA and 10FB, nibs 2N provided on the outer periphery of the carrier housing 2 in correspondence to the hook members 10FA, 10FB, and torsion coil springs (not shown) for biasing the hook members 10FA, 10FB in the direction of being engaged with the nibs 2N.

Accordingly, when the bare chip is tested, upon disposing the pressing cap 14 on the bare chip located in advance relative to the bumps 6B of the sheet with electrodes 6, the pressure body 16 of the pressing cap 14 is housed in the housing portion 2A so that tip ends of the hook members 10FA, 10FB of the cap body 20 in the pressing cap 14 are rotated away from each other.

When the pressing cap 14 is mounted into the housing portion 2A of the carrier housing 2, the cap body 20 is mounted into the housing portion 2A of the carrier housing 2 while the outer periphery thereof is guided by a wall defining the housing portion 2A provided in the carrier housing 2. Thereafter, the tip ends of the hook members 10FA, 10FB of the latch mechanism 10 are rotated by the bias of the torsion coil springs in the direction of being closer to each other and engage with the nibs 2N. As a result, the pressing cap 14 is held on the carrier housing 2 in a state wherein the bare chip is pressed by the pressing portions 16s of the pressure body 16.

SUMMARY OF THE INVENTION

When such a carrier unit is packed for the purpose of transportation, there may be case wherein one pressing cap 14 and one carrier housing 2 are combined together without mounting the bare chip within the housing portion 2A of the carrier housing 2 as shown in FIG. 13.

If the carrier unit is transported in such a type of packing, there is a risk in that the bumps 6B may collapse due to the normal interference of the pressing portions 16s of the pressure body 16 with the tip ends of the bumps 6B. As a countermeasure thereto, it is thought that a cushioning material or others is interposed between the bumps 6B and the pressing portions 16s of the pressure body 16 during the packing process.

When the carrier unit is directly supplied to a test station in a production line, however, there may be a problem in that the packing and unpacking operation are troublesome and the air cleanliness in the test station deteriorates due to the removal of the cushioning material or others.

In view of such a problem, an object of the present invention is to solve such a problem of the prior art by providing a semiconductor device carrier unit for housing a bare chip in a detachable manner and a semiconductor socket provided therewith, wherein even if the pressing cap and the carrier housing are combined together without the bare chip therebetween, no collapse occurs in the bumps of the connecting substrate.

To achieve the above-mentioned object, a semiconductor device carrier unit according to the present invention comprises a carrier housing having a housing portion for detachably housing a semiconductor device, a connecting substrate having bumps to be electrically connected to a group of terminals in the semiconductor device and disposed in the housing portion of the carrier housing, for inputting/outputting signals relative to the semiconductor device, and a pressing member for pressing the terminals of the semiconductor device onto the bumps of the connecting substrate, wherein the pressing member has recesses in an area opposed to the connecting substrate; each of the recesses having a size larger than that of the bump.

Also, a semiconductor device socket provided with the inventive semiconductor device carrier unit comprises a socket body having a housing portion for detachably housing the semiconductor carrier unit as claimed in claim 1, and a group of contacts provided in the socket body, for being electrically connected to the connecting substrate in the semiconductor device carrier unit.

As apparent from the above description, according to the inventive semiconductor device carrier unit and the semiconductor socket provided therewith, since the pressing member has the recess larger in size than the bump at a position opposed to the bump in the connecting substrate, there is no risk of the collapse of the bumps in the connecting substrate if the pressing cap and the carrier housing are combined together without the bare chip therebetween.

The above and other objects, effects, features and advantages of the present invention will become more apparent from the following description of embodiments thereof taken in conjunction with the accompanying drawings.

DETAILED DESCRIPTION OF PREFERRED EMBODIMENTS

Figure 2:
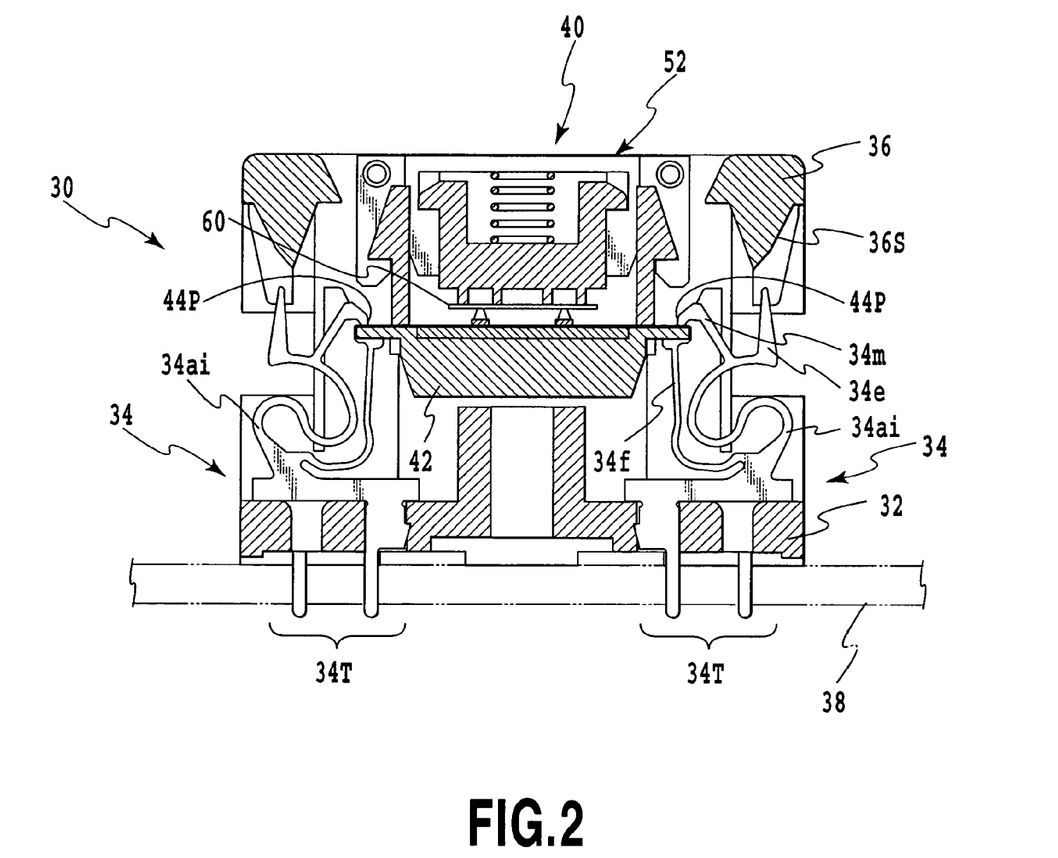
FIG. 2 is a sectional view of a semiconductor device socket provided with the semiconductor device carrier unit according to the present invention, taken along a line II-II in FIG. 3.
Figure 3:
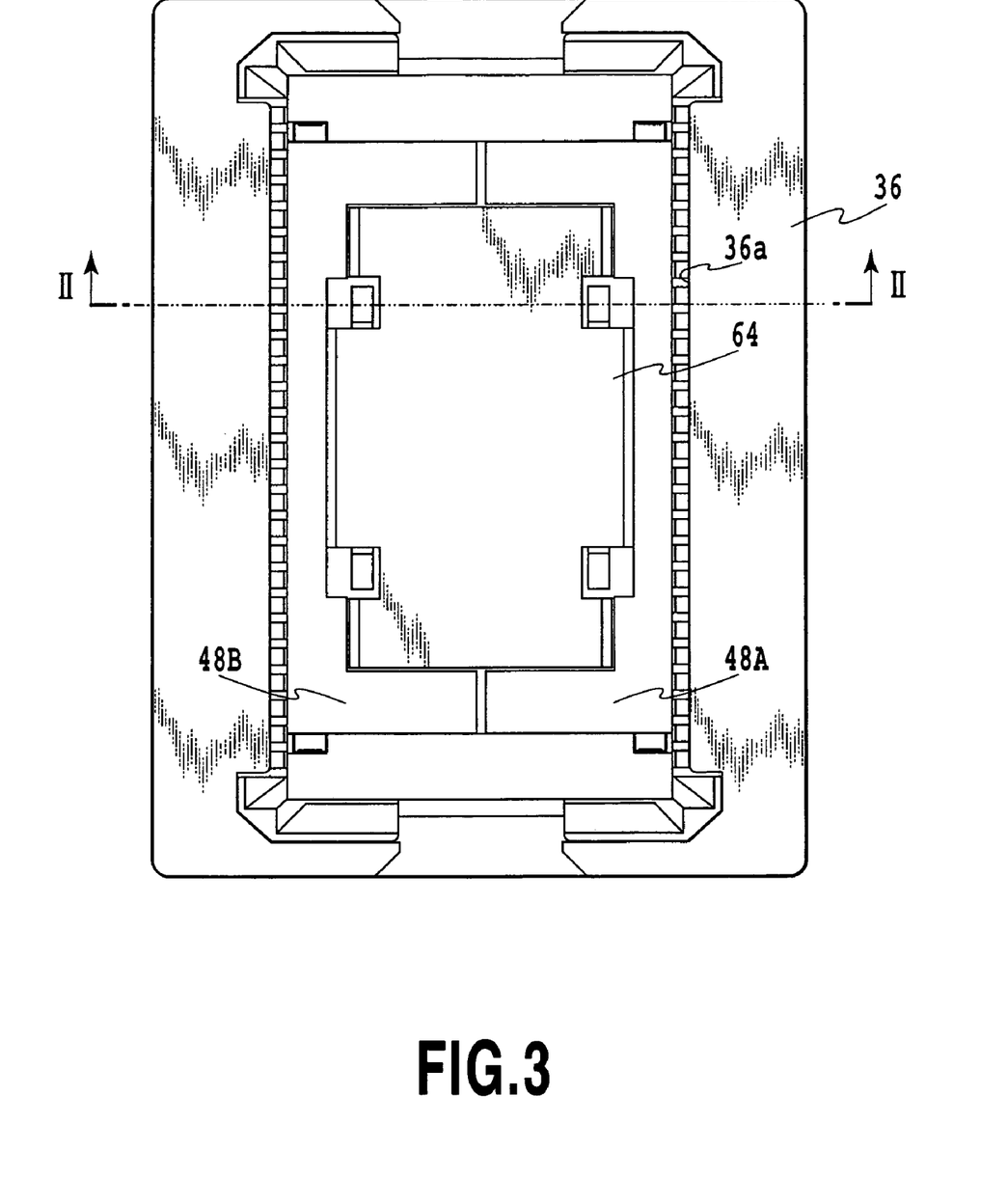
FIG. 3 is a plan view of the embodiment shown in FIG. 2.

FIG. 2 illustrates one embodiment of a semiconductor device socket according to the present invention.

In the semiconductor device socket shown in FIG. 2, a carrier unit 40 for housing a bare chip 60 as a semiconductor device in the interior thereof, and an IC socket 30 for housing the carrier unit in a detachable manner in a housing portion are provided.

The IC socket 30 is disposed on a printed circuit board 38 for inputting a test signal to the bare chip 60 and outputting a detected output signal from the bare chip 60. The IC socket 30 mainly includes a main body 32 having a housing portion for housing the carrier unit 40, a group of contacts 34 provided in the main body 32 to be electrically connected to the respective pads in a sheet with electrodes 44 described later which is a constituting element in the carrier unit 40, and a cover member 36 disposed to be movable upward/downward relative to the main body 32, for selectively electrically connecting the respective contacts in the group of contacts to the respective pads in the sheet with electrodes 44.

Figure 4:
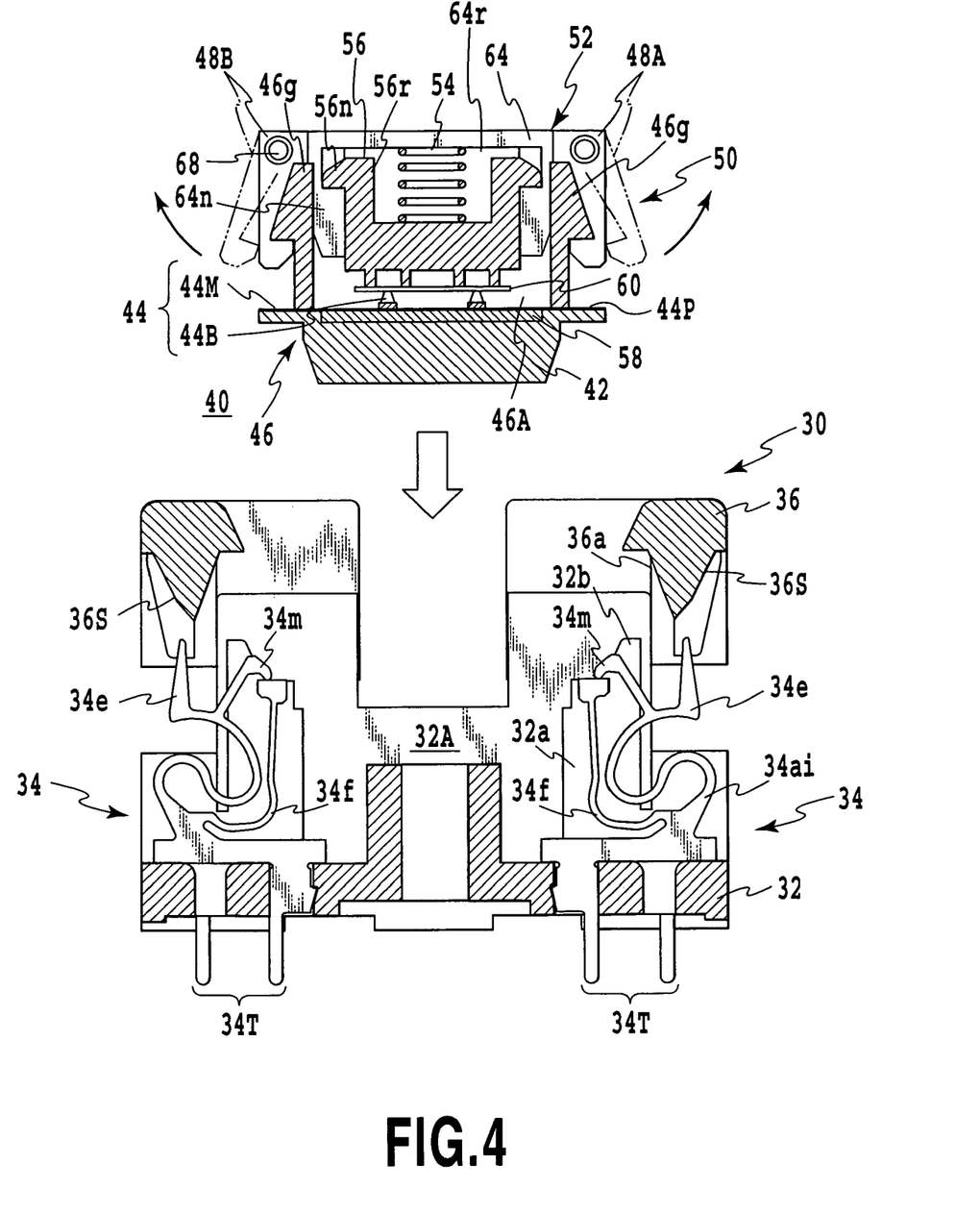
FIG. 4 is an exploded-sectional view of a semiconductor device socket provided with the inventive semiconductor device carrier unit, taken along a line IV-IV in FIG. 5.

The main body 32 molded with resinous material is disposed at a predetermined position in correspondence to an electrode portion in the printed circuit board 38. The main body 32 has a housing portion 32A for housing the carrier unit 40 as shown in FIG. 4. The housing portion 32A opening upward is defined while being encircled with an inner circumference of a lower basal portion 32a to be engaged with a lower portion of a base of the carrier unit 40 described later and an inner circumference of an upper basal portion 32b contiguous to the upper portion of the base of the carrier unit 40 to be engaged with an upper portion of the base of the carrier unit 40. In the lower basal portion 32a, the group of contacts 34 are supported. In the lower basal portion 32a and the upper basal portion 32b, slits into which a plurality of contacts 34ai (i=1 to n; n is an integer) composed of the group of contacts 34 are inserted are formed at a predetermined pitch while extending in the vertical direction relative to a paper surface. The every adjacent slits are sectioned by a partitioning wall. The respective contacts 34ai are arranged at a pitch generally vertical to a paper surface. The group of contacts 34 are provided along opposite sides in a generally rectangular housing portion 32A.

The respective contact 34ai includes a terminal 34T press-fit into a through-hole of the lower basal portion 32a, a fixed contact section 34f contiguous to the terminal 34T and electrically connected from a lower side to a pad 44P of the sheet with electrodes 44 described later, an elastic movable contact section 34m contiguous to the terminal 34T and electrically connected from an upper side to the pad 44P, and an engaged section 34e branched from the movable contact section 34m and selectively engaged with a slanted surface of the cover member 36 described later to rotate the movable contact section 34m away from the fixed contact section 34f.

The cover member 36 molded with resinous material has an opening 36a for allowing the carrier unit 40 to pass therethrough as shown in FIG. 4. A frame portion forming the periphery of the opening 36a is supported to be movable upward and downward by legs guided along grooves provided on the outer circumference of the main body 32. In this regard, the cover member 36 is biased away from the main body 32 by an elastic member not shown. At lower ends of the respective sides of the frame portion, slanted surfaces 36s are formed as shown in FIG. 4. The slanted surface 36a engages with the engaged section 34e of the above-mentioned contact 34ai when the cover member 36 descends toward the main body 32 to a predetermined position to rotate the movable contact section 34m against the elasticity thereof away from the fixed contact section 34f. In this regard, FIG. 4 illustrates a state wherein the movable contact section 34m and the fixed contact section 34f are brought into contact with each other.

When the carrier unit 40 described later is mounted to the housing portion 32A of the IC socket 30, the cover member 36 is depressed at a predetermined distance and held there to move the respective movable m contact portion 34m in the contact group 34 to a waiting position away from the housing portion 32A, after which the carrier unit 40 is located in the housing portion 32A through the opening 36a from above and placed there.

At that time, the respective fixed contact portion 34f is brought into contact with a lower surface of the respective pad 44P of the sheet with electrodes 44 in the carrier unit 40.

Subsequently, when the cover member 36 in a held state is released, the cover member 36 moves upward due to a resultant force of a restoring force of the above-mentioned elastic member and the elastic force of the engaged section 34e in the respective contact 34ai.

At that time, the respective movable contact section 34m in the contact group 34 is restored to the original position and brought into contact with the upper surface of the pad 44P of the sheet with electrodes 44 in the carrier unit 40. Thereby, as shown in FIG. 2, the sheet with electrodes 44 and the two groups of contacts 34 are electrically connected with each other.

As shown in FIG. 4, the carrier unit 40 includes, as main elements, a carrier housing 46 having a housing portion 46A for housing a bare chip 60, a sheet with electrodes 44 disposed on a base member 42 forming a bottom of the housing portion 46A of the carrier housing 46 via an elastic sheet 58 made of rubber, a pressing cap 52 having a pressure body 56 for pressing the electrode group of the bare chip 60 onto the bumps 44B of the sheet with electrodes 44, and a latch mechanism 50 for selectively holding the pressing cap 52 on the carrier housing 46.

On the sheet with electrodes 44 in the carrier housing 46, there are projections 46g opposed to each other as walls defining the housing portion 46A. The respective projection 46g also guides an outer circumference of a lower portion of the cap body 64 forming part of the pressing cap 52, when the pressing cap 52 is mounted. Further, the respective projection 46g has a nib as a latch portion at a tip end thereof with which a nib of a hook member 48A or 48B described later is selectively engaged.

As shown in FIG. 4, the sheet with electrodes 44 has a plurality bumps 44B arranged in correspondence to the electrode group of the bare chip 60 to be electrically connected thereto in a substrate 44M. The respective bump 44B made for example, of copper or others has a root of approximately 100 μm diameter and is protruded from a surface of the substrate 44M to a predetermined height. The substrate 44M is a thin plate made, for example, of polyimide resin to have a thickness of approximately several tens of μm.

The respective bump 44B is connected to the respective pad 44p via a conductor layer made of copper foil. A plurality of pads 44p are formed at opposite ends of the sheet with electrodes 44 projected from opposite ends of the base member 42 in the substrate 44M.

In this embodiment, sheet with electrodes 44 having bumps 44B is not be limited to this example but may be a sheet with contact portion of a elastic platy or linear contact.

Figure 7A:
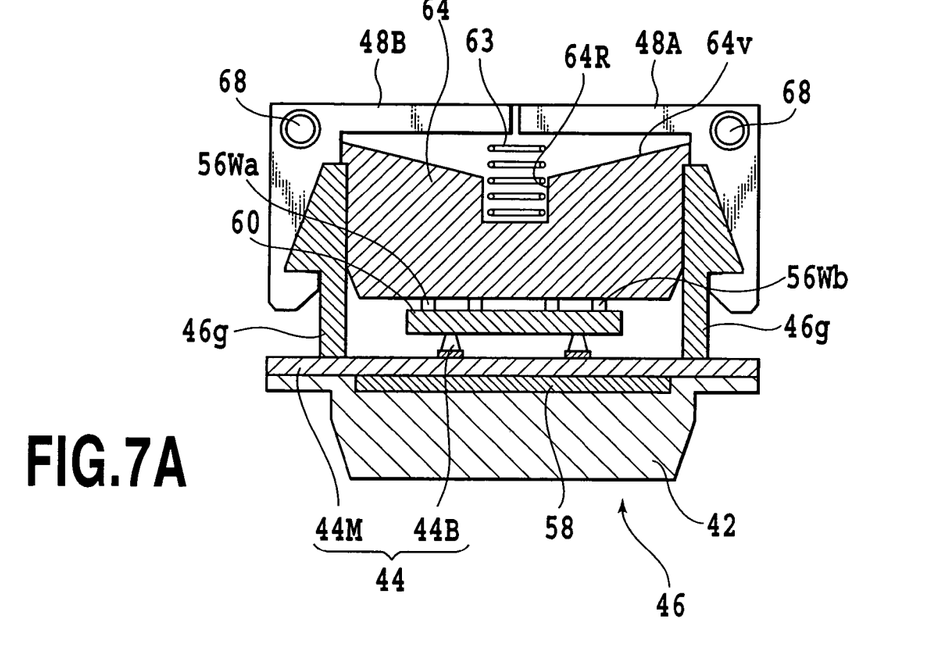
FIGS. 7A and 7B are sectional views, respectively, taken along a line VIIA-VIIA in FIG. 5.
Figure 7B:
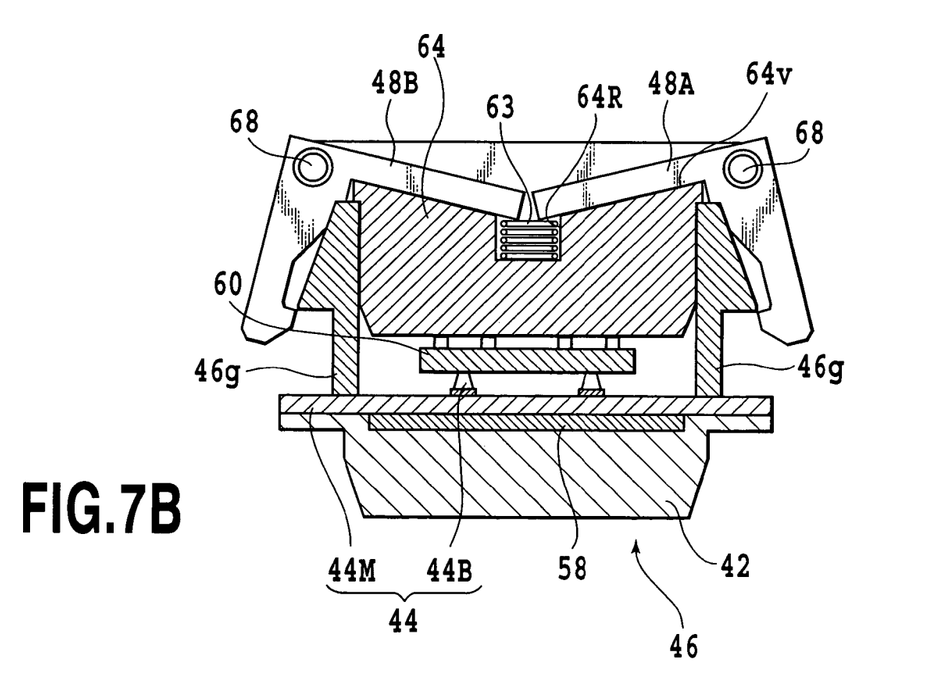

As shown in FIGS. 4, 7A and 7B, the latch mechanism 50 includes the hook members 48A, 48B supported in a rotational movable manner at opposite ends of the cap body 64 of the pressing cap 52 described later for holding the cap body 64 of the pressing cap 52, coil springs 63 for biasing the hook members 48A and 48B opposite to the direction indicated by an arrow in FIG. 4; i.e., in the direction of engaging them with the nibs of the projections 46g in the carrier housing 46, and supporting pins 68 for supporting the hook members 48A, 48B in a rotational movable manner.

Figure 5:
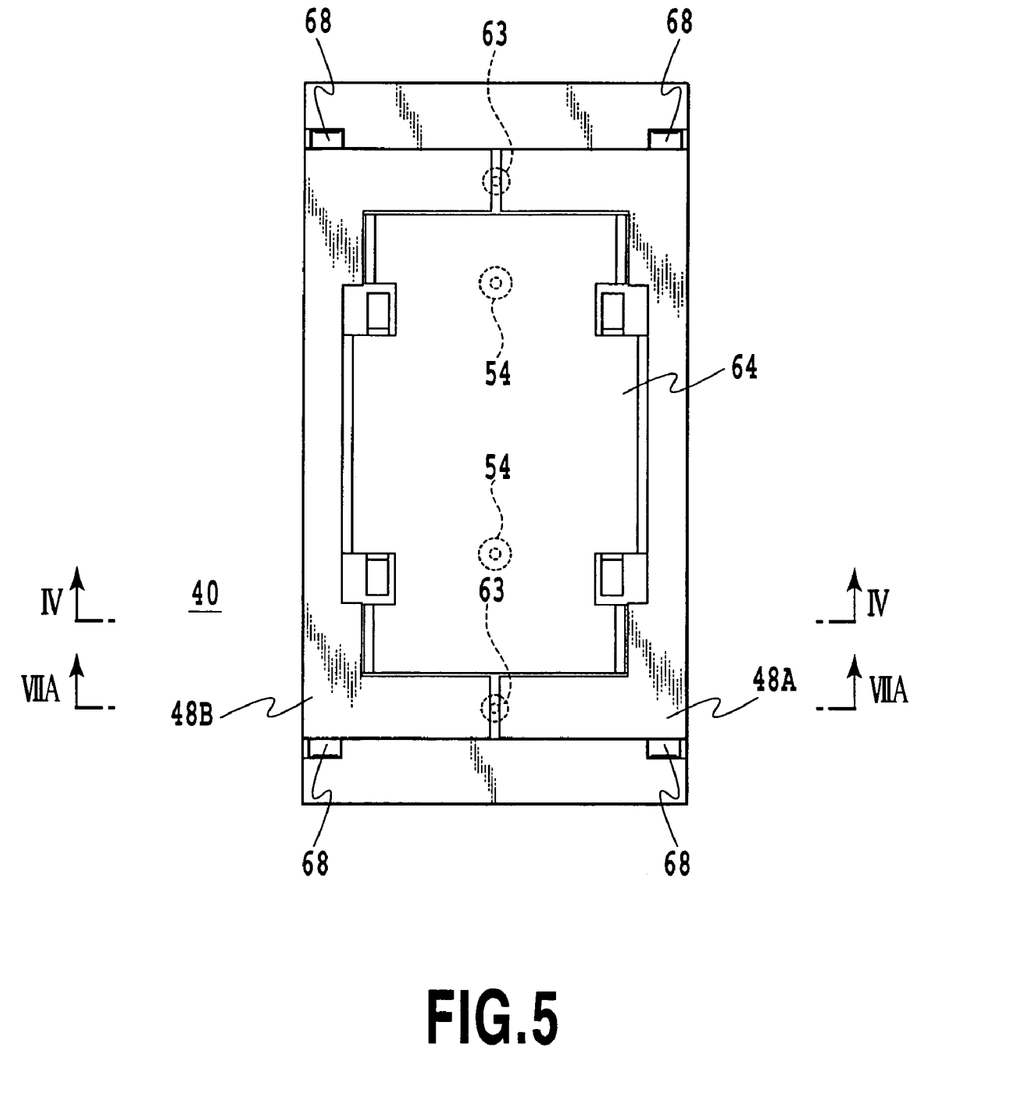
FIG. 5 is a plan view of the embodiment shown in FIG. 1.

As shown in FIG. 5, the supporting pin 68 is supported at one end by the cap body 64 and fixed at the other end to a corner of the hook member 48A, 48B having a generally L-shaped cross-section.

The hook members 48A and 48B are arranged opposite to each other in the cap body 64 while interposing the pressure body 56 described later between them. The hook member 48A and 48B are supported in a rotational movable manner at the corners thereof by the supporting pins 68, and have nibs at one ends thereof engageable with those in the projections 46g of the carrier housing 46. The other ends of the hook members 48A and 48B located above the coil spring 63 are adjacent to each other at a predetermined gap as shown in FIG. 7A. When the nib thereof is not engaged with the nib of the projection 46g in the carrier housing 46, as shown in FIG. 7B, the other ends of the hook members 48A and 48B are pushed against the bias of the coil spring 63 and brought into contact with a slanted surface 64v forming a V-shaped valley in the upper part of the cap body 64.

As shown in FIGS. 5 and 7A, the coil springs 63 are arranged in two recesses 64R formed at a position at which the slanted surfaces 64v of the cap body 64 meet together. When the other ends of the hook members 48A and 48B are not pressed, the upper end of the respective coil spring 63 projects from the upper edge of the recess 64R at a predetermined length.

As shown in FIGS. 4 and 7A, the pressing cap 52 includes the pressure body 56 having pressing portions 56wa and 56wb to be in contact with the upper surface of the bare chip 60, the cap body 64 for housing a base of the pressure body 56, and two springs 54 (see FIG. 5) disposed in a space between a recess 56r of the base of the pressure body 56 and the cap body 64, for biasing the pressure body 56 toward the bare chip 60. In this regard, FIGS. 2 and 4 illustrate a state wherein the pressure body 56 of the pressing cap 52 presses the bare chip 60. In this regard, the number of the springs 54 is not limited to this example but may be three or more.

The bare chip 60 of a generally square shape has a lower surface for opposing a predetermined electrode group to the bumps 44B in the sheet with electrodes 44.

The base of the pressure body 56 is inserted into the recess 64r of the cap body 64 in a movable manner. At an end of part of the pressure body 56 inserted into the recess 64r, a plurality of nibs 56n engaged with nibs 64n provided at a lower end of the cap body 64 are formed opposite to the latter. Thereby, the pressure body 56 is held in the interior of the cap body 64 while being biased by the elastic member such as a spring 54.

Figure 1:
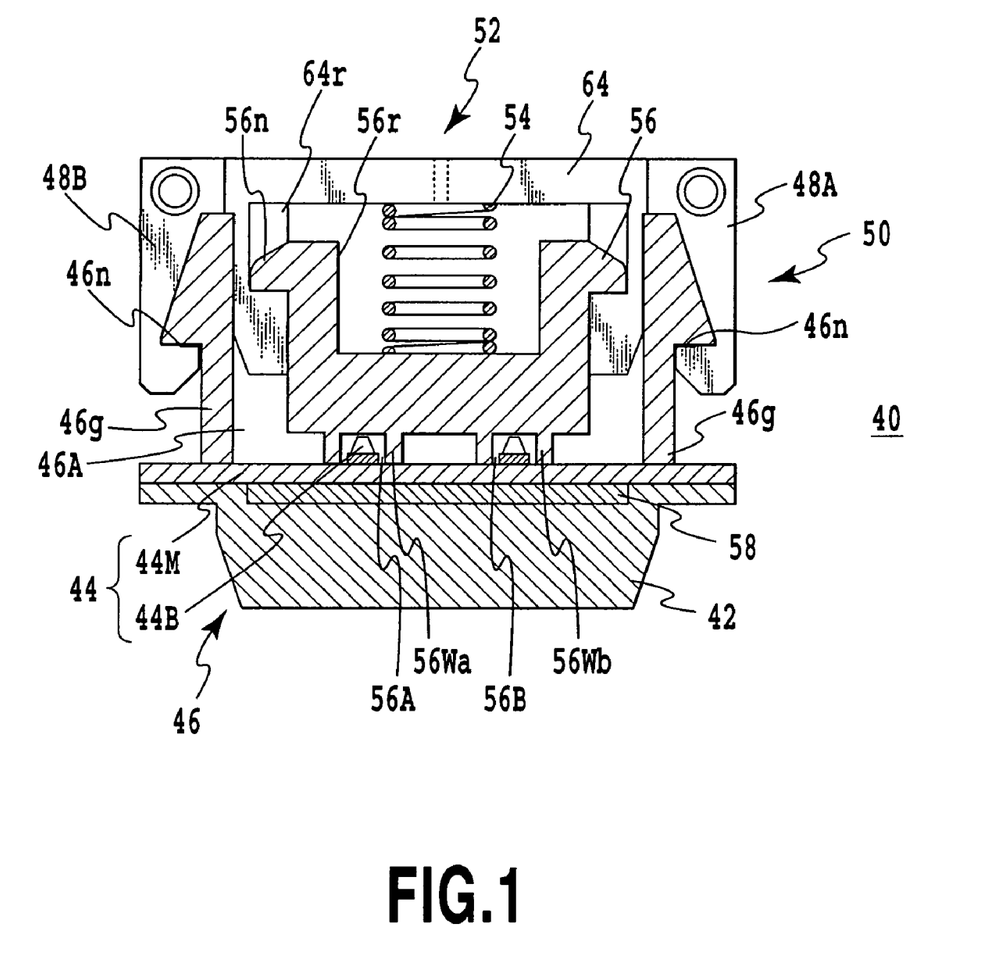
FIG. 1 is a sectional view of one embodiment of a semiconductor carrier unit according to the present invention.
Figure 6:
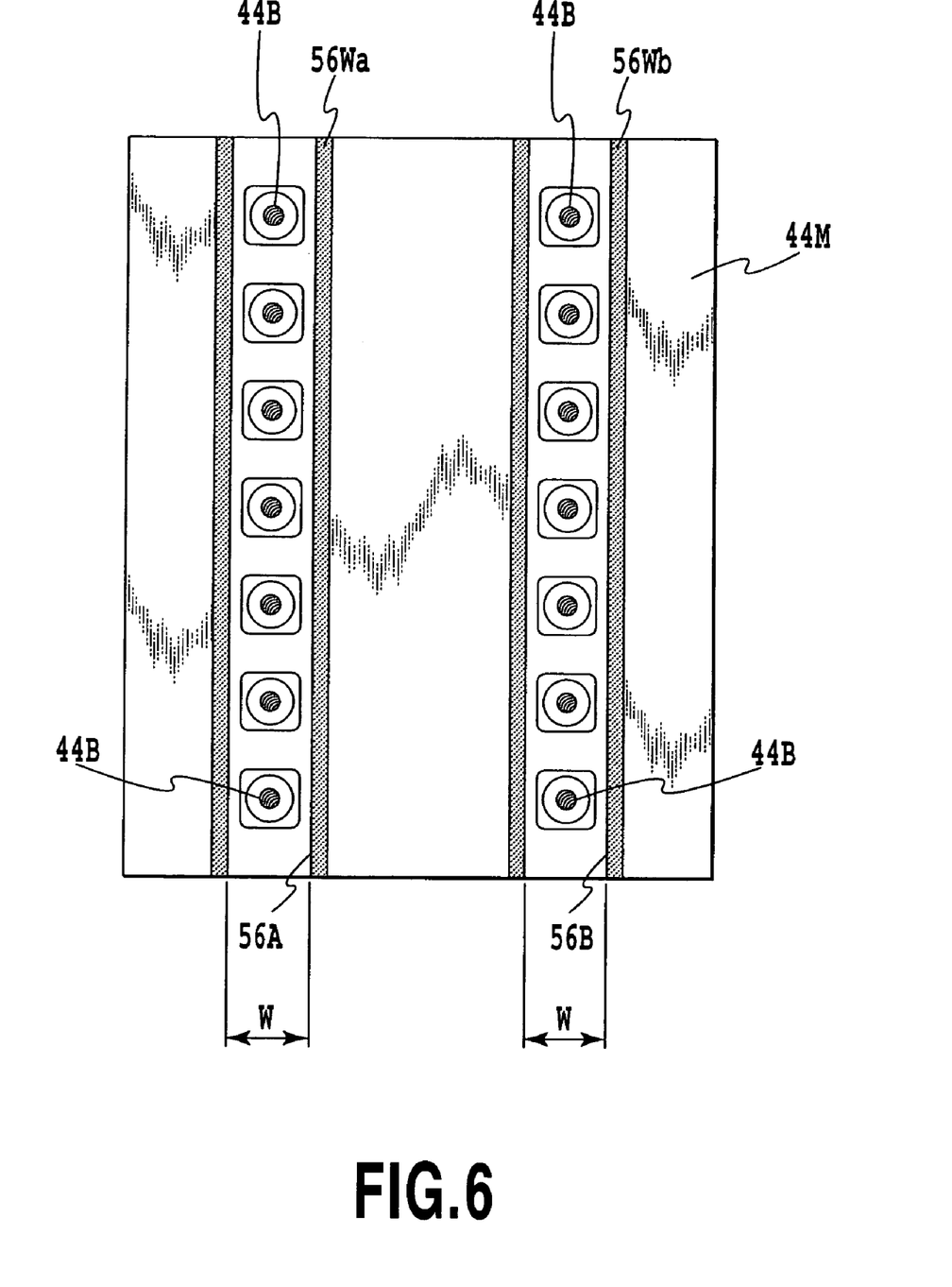
FIG. 6 is a schematic sectional view illustrating a pressing portion of a pressure body together with a sheet with electrodes.
Figure 8A:
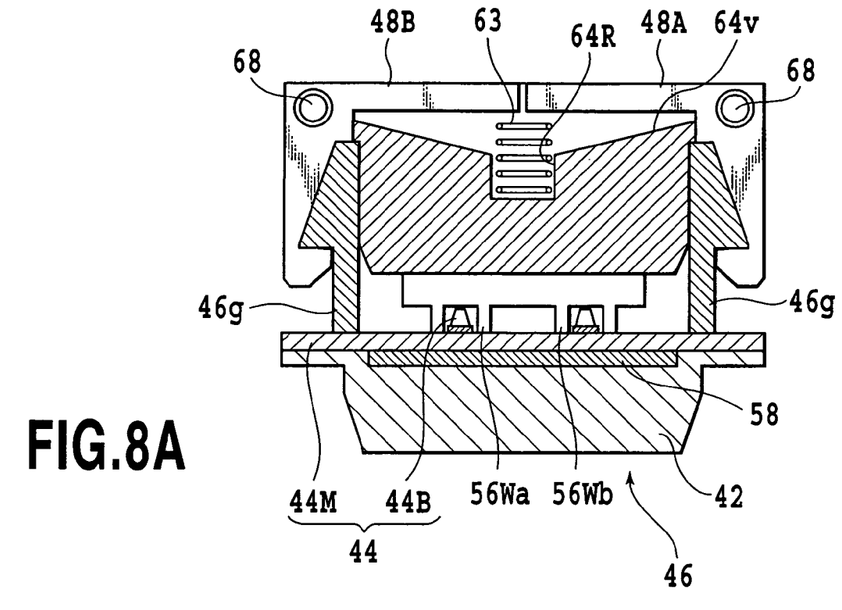
FIGS. 8A and 8B are sectional views corresponding to FIGS. 7A and 7B, respectively, in a state wherein no bare chip is mounted.
Figure 8B:
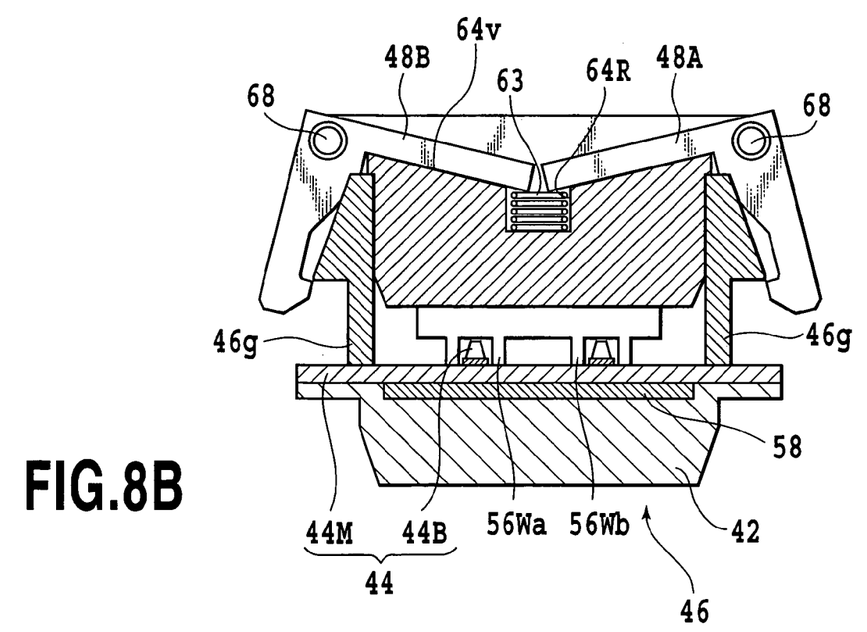
Figure 9:
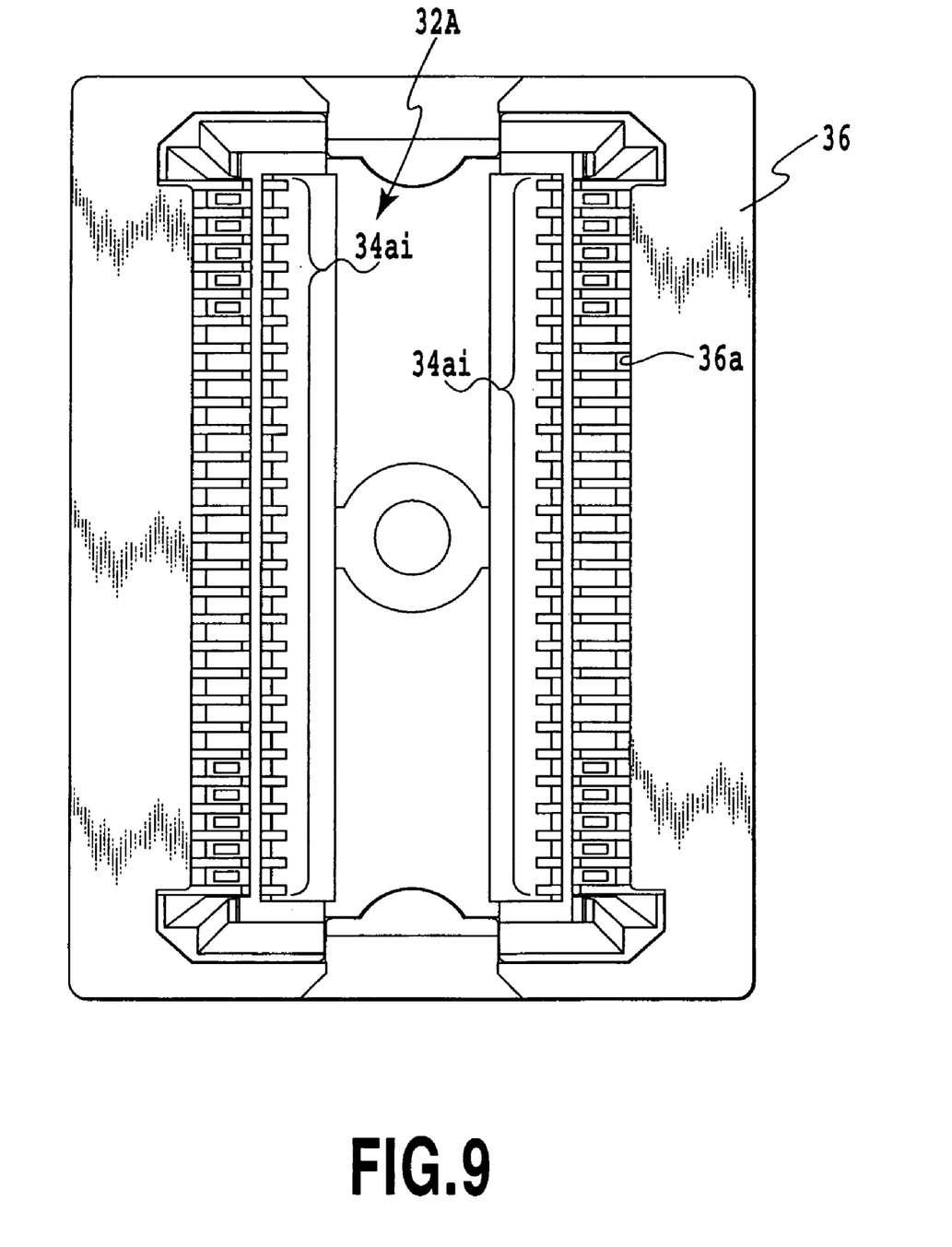
FIG. 9 is a plan view of another embodiment of the semiconductor device socket according to the present invention on which no semiconductor device carrier unit is mounted.

The pressing portions 56wa and 56wb of the pressure body 56 are formed generally parallel to each other at a predetermined gap in correspondence to the arrangement of the bumps 44B on the above-mentioned sheet with electrodes 44 as shown in FIG. 6. The pressing portion 56wa has a recess 56A having a depth larger than a projected height of the bump 44B. A width W of the recess 56A is selected to be in a range from 0.4 mm to 0.5 mm, for example. Also, the pressing portion 56wb has a recess 56B having a depth larger than a projected height of the bump 44B. A width W of the recess 56B is selected to be larger than a diameter of the bump 44B, for example, in a range from 0.4 mm to 0.5 mm. Thereby, as shown in FIGS. 1, 8A and 8B, even if the bare chip 60 is not interposed between the pressure body 56 and the sheet with electrodes 44, the end surfaces of the pressing portions 56wa and 56wb are in contact with the surface of the sheet with electrodes 44 to avoid the interference of the bumps 44B with the pressure body 56; that is, the bumps 44B are safely housed in the recesses 56A and 56B without being collapsed. Also, since the pressing portions 56wa and 56wb have the recesses 56A and 56B, respectively, there is no risk to be excessively in tight contact with the surface of the bare chip 60.

In such a structure, when the bare chip 60 is mounted into the carrier unit 40 for the predetermined test, a group of the electrodes in the bare chip 60 are first positioned relative to the bumps 44B in the sheet with electrodes 44 so that the electrode group of the bare chip 60 are brought into contact with the bumps 44B.

Then, the pressing cap 53 is inserted into the housing portion 46A of the carrier housing 46. At that time, as shown in FIG. 7B, the hook members 48A and 48B of the latch mechanism 50 are made to rotate against the bias of the coil springs 63 so that the tip ends thereof are away from each other. The pressing portions 56wa and 56wb of the pressure body 56 are pressed onto the upper surface of the bare chip 60 against the bias of the spring 54, while the outer circumference of the cap body 64 is guided by the inner surfaces of the projections 46g.

Subsequently, the hook members 48A and 48B are made to rotate by the bias of the coil spring 63 so that the tip ends thereof are close to each other and engaged with the nibs 46n of the projections 46 in the carrier housing 46. As a result, as shown in FIGS. 4 and 7A, the pressing cap 52 is held by the carrier housing 46.

On the other hand, when the carrier unit 40 on which no bare chip 60 is mounted is transported, first, the pressing cap 52 is combined with the carrier housing 46. That is, the pressing cap 52 is mated with the carrier housing 46 so that the respective bumps 44B are arranged in the recesses 56A and 56B of the pressing portions 56wa and 56wb in the pressure body 56 of the pressing cap 52. Accordingly, as described above, the respective bumps 44B are disposed in the recesses 56A and 56B without the interference with the pressure body 56; i.e., without being collapsed.

Figure 12:
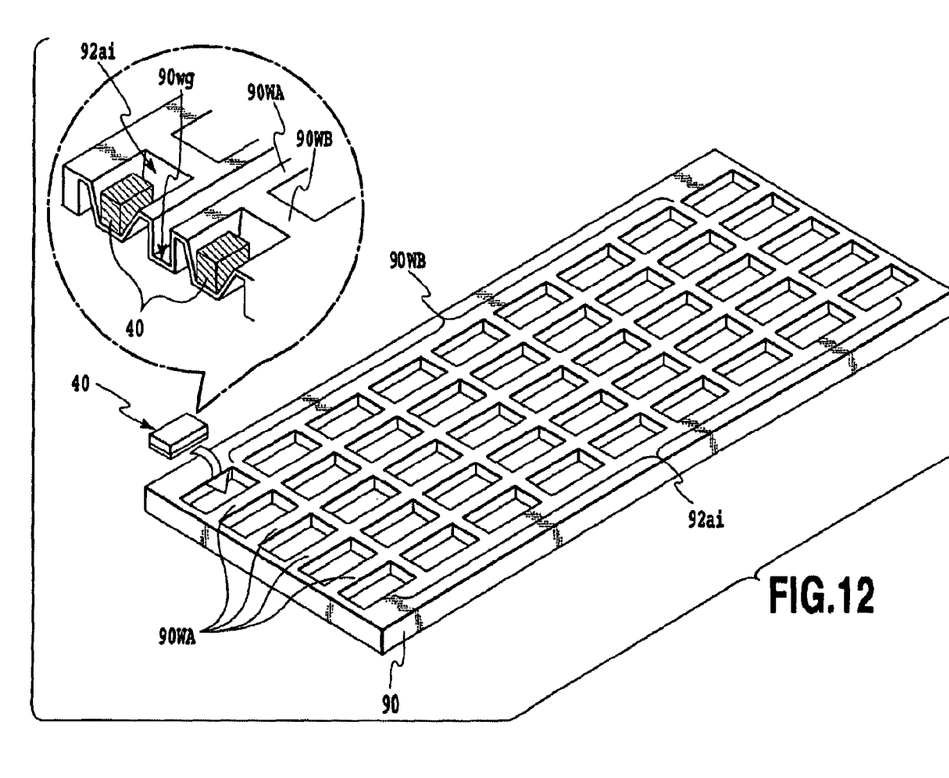
FIG. 12 is a perspective view of a tray used for the transportation of the semiconductor device carrier unit.

Then, a predetermined number of the carrier units 40 combined as described above are packed in a transportation tray 90 as shown in FIG. 12.

As shown in FIG. 12, the transportation tray 90 has a plurality of cells 92ai (i=1 to n; n is an integer) for housing the respective carrier units 40 arranged in a matrix manner. The respective cell 92ai is sectioned by partitioning walls 90WA and 90WB. In the partitioning wall 90WA, a thin groove 90wg is formed.

Figure 10:
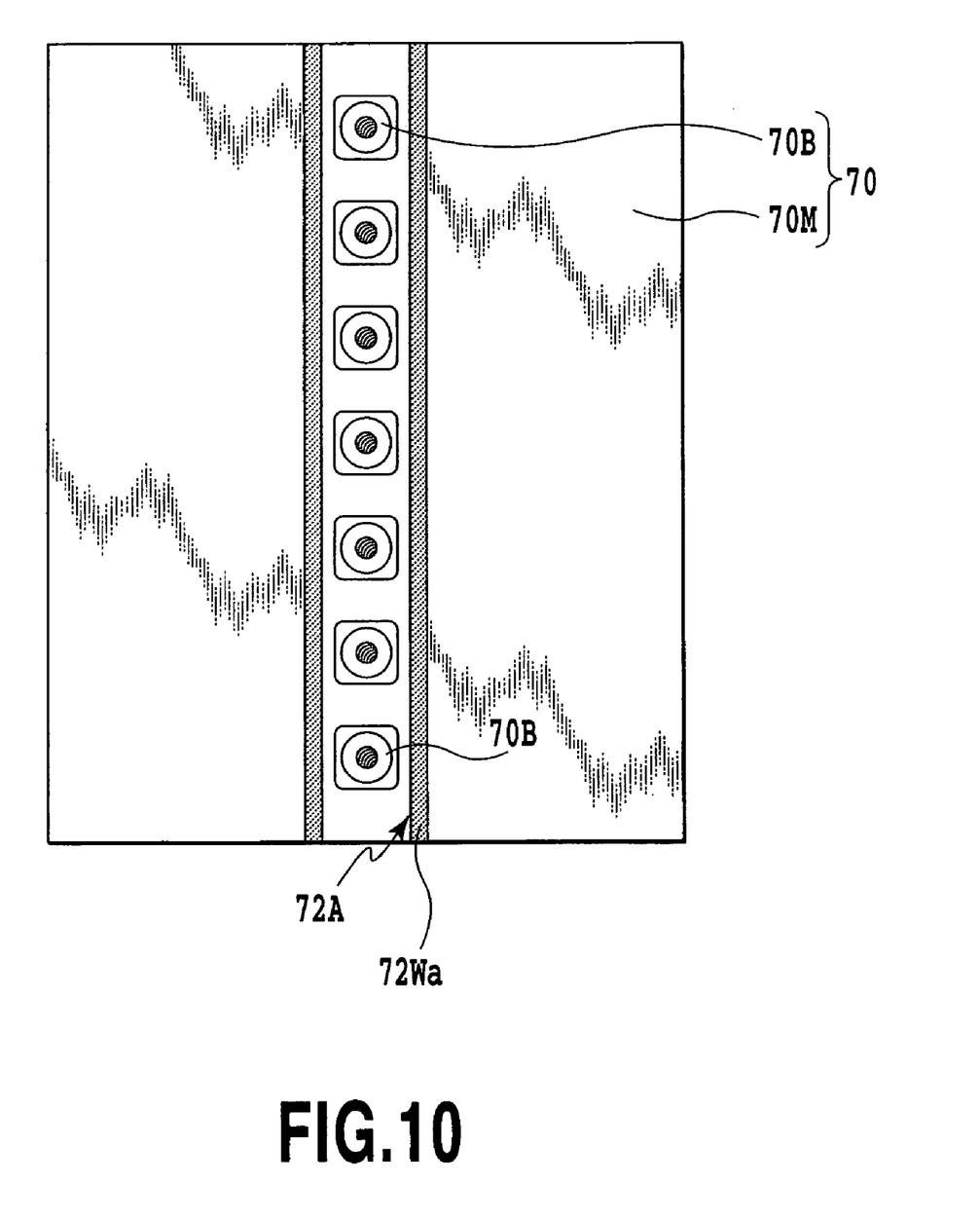
FIG. 10 is a schematic sectional view illustrating further embodiment of a pressing portion in a pressure body used in the semiconductor device carrier unit according to the present invention together with a sheet with electrodes.
Figure 11:
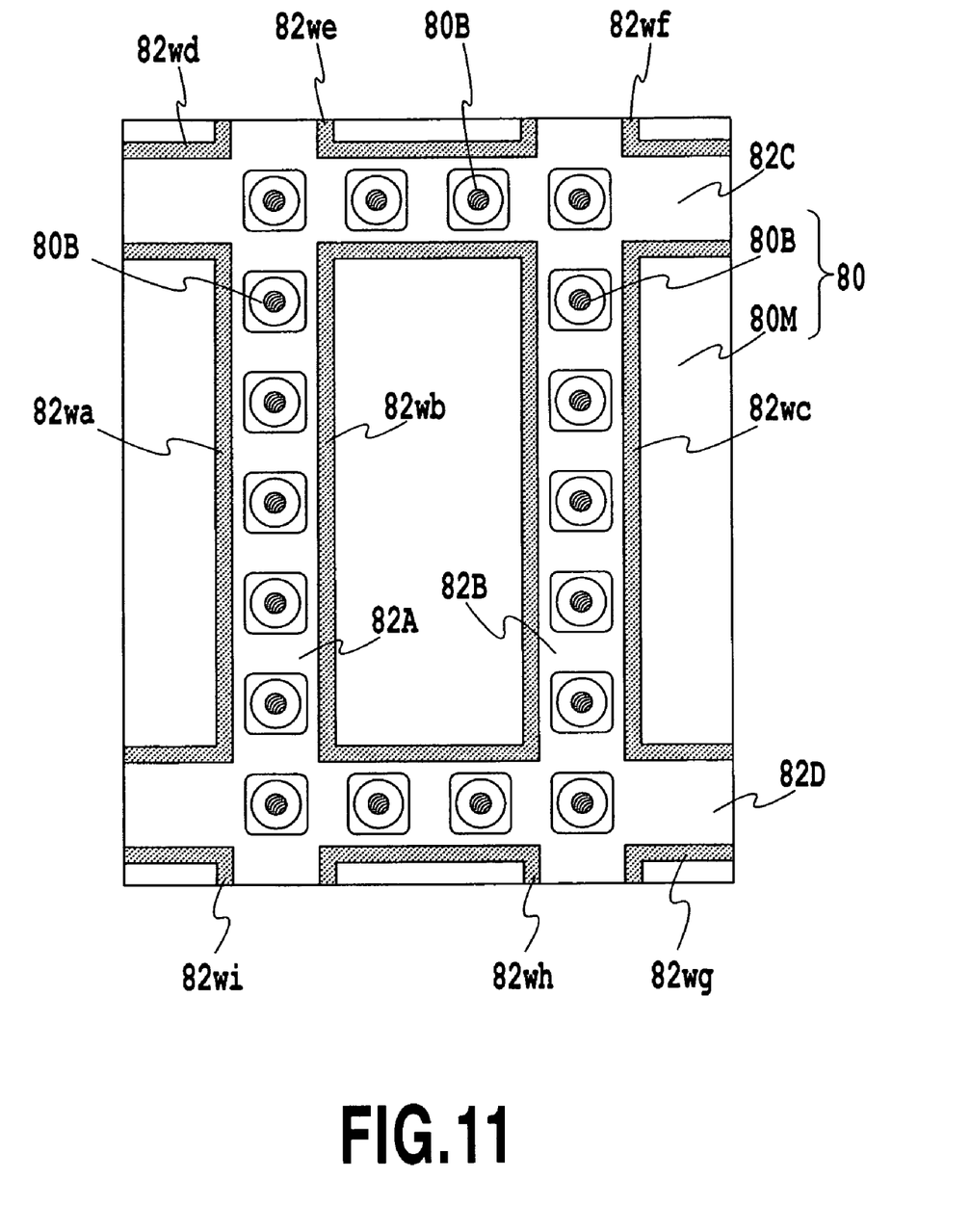
FIG. 11 is a schematic sectional view illustrating furthermore embodiment of a pressing portion in a pressure body used in the semiconductor device carrier unit according to the present invention together with a sheet with electrodes.

In this regard, while the plurality of pressing portions 56wa and 56wb are formed generally parallel to each other in the above example, as shown in FIG. 6, this is not limitative, but a single pressing portion 72wa as shown in FIG. 10 or that arranged in a picture-frame manner as shown in FIG. 11 may be employed.

In the example shown in FIG. 10, a sheet with electrodes 70 has a single row of bumps 70B in a substrate 70M, arranged in correspondence to the electrode group of the bare chip to be electrically connected thereto.

On the other hand, the pressing portion 72wa of the pressure body has a recess 72A having a depth larger than a height of a bump 70B and a width larger than a diameter of the bump 70B, extending in the arrangement direction of the bumps 70B.

In the example shown in FIG. 11, a sheet with electrodes 80 has a plurality of bumps 80B in a substrate 80M, arranged in a picture-frame manner in correspondence to the electrode group of the bare chip to be electrically connected thereto. On the other hand, the pressing portion of the pressure body has grid-like recesses 82A, 82B, 82C and 82D formed at a predetermined distance to be orthogonal to each other. The respective recess 82A to 82D has a depth larger than a height of a bump 80B and a width larger than a diameter of the bump 80B. Also, on the periphery of the recesses 82A to 82D, there are pressing walls 82wa, 82wb, 82wc, 82wd, 82we, 82wf, 82wi, 82wh and 82wg.

The present invention has been described in detail with respect to preferred embodiments, and it will now be apparent from the foregoing to those skilled in the art that changes and modifications may be made without departing from the invention in its broader aspect, and it is the intention, therefore, in the apparent claims to cover all such changes and modifications as fall within the true spirit of the invention.

What is claimed is:

1. A semiconductor device carrier unit, comprising:
   a carrier housing having a housing portion for detachably housing a semiconductor device;
   a connecting substrate having bumps to be electrically connected to a group of terminals in said semiconductor device and disposed in said housing portion of said carrier housing, for inputting/outputting signals relative to said semiconductor device; and
   a pressing member for pressing said terminals of said semiconductor device onto said bumps of said connecting substrate;
   wherein said pressing member has recesses in an area opposed to said connecting substrate, each of said recesses having a size larger than that of said bump and configured to receive the bump when the semiconductor device is not housed.

2. A semiconductor device carrier unit as claimed in claim 1, wherein said recesses are formed in a plurality of rows generally parallel to each other.

3. A semiconductor device carrier unit as claimed in claim 1, wherein said recesses are formed as rows and columns in an orthogonal manner.

4. A semiconductor device socket provided with a semiconductor device carrier unit, comprising:
   a socket body having a housing portion for detachably housing said semiconductor carrier unit as claimed in claim 1; and
   a group of contacts provided in said socket body, for being electrically connected to said connecting substrate in the semiconductor device carrier unit.

* * * * *